Nov. 7, 1972 HANS-HERMANN MERKENSCHLAGER 3,702,284

PROCESS OF PRODUCING PLATED THROUGH-HOLE PRINTED CIRCUIT BOARDS

Filed Oct. 16, 1969

United States Patent Office 3,702,284

Patented Nov. 7, 1972

3,702,284
PROCESS OF PRODUCING PLATED THROUGH-HOLE PRINTED CIRCUIT BOARDS

Hans-Hermann Merkenschlager, Munich, Germany, assignor to Siemens Aktiengesellschaft, Berlin and Munich, Germany Filed Oct. 16, 1969, Ser. No. 866,876
Claims priority, application Germany, Dec. 4, 1968, P 18 12 692.6
Int. Cl. B44d *1/18;* C23b *5/48*
U.S. Cl. 204—15 4 Claims

ABSTRACT OF THE DISCLOSURE

Plated through-hole printed circuit boards are produced by printing a first resist material (i.e. photoresist) onto appropriate metal-clad laminate board surfaces in a pattern predetermined by the desired circuits and then uniformly coating all of the board surfaces with a second resist material (i.e. a nitrocellulose lacquer) and producing desired through-holes between selected areas of the coated board surfaces. Thereafter a layer of a first metal (i.e. Cu) is applied onto the through-hole walls and on the coated surfaces by a metal-reduction process and such metal layer is then removed from only the coated surfaces and a layer of a second metal (i.e. Au) is electroplated onto metal-receptive hole walls and/or board surfaces. Then the second resist material is removed from the board surfaces and then portions of the metal-clad are removed from the board surfaces in a pattern predetermined by the desired circuits. The electroplating can occur before or after the removal of the second resist material; when occurring before, the second metal is electroplated only on the coated through-hole walls and when occurring after, the second metal is electroplated on the coated through-hole walls and on the metal-clad board surfaces free of resist material.

Figures 1, 2:
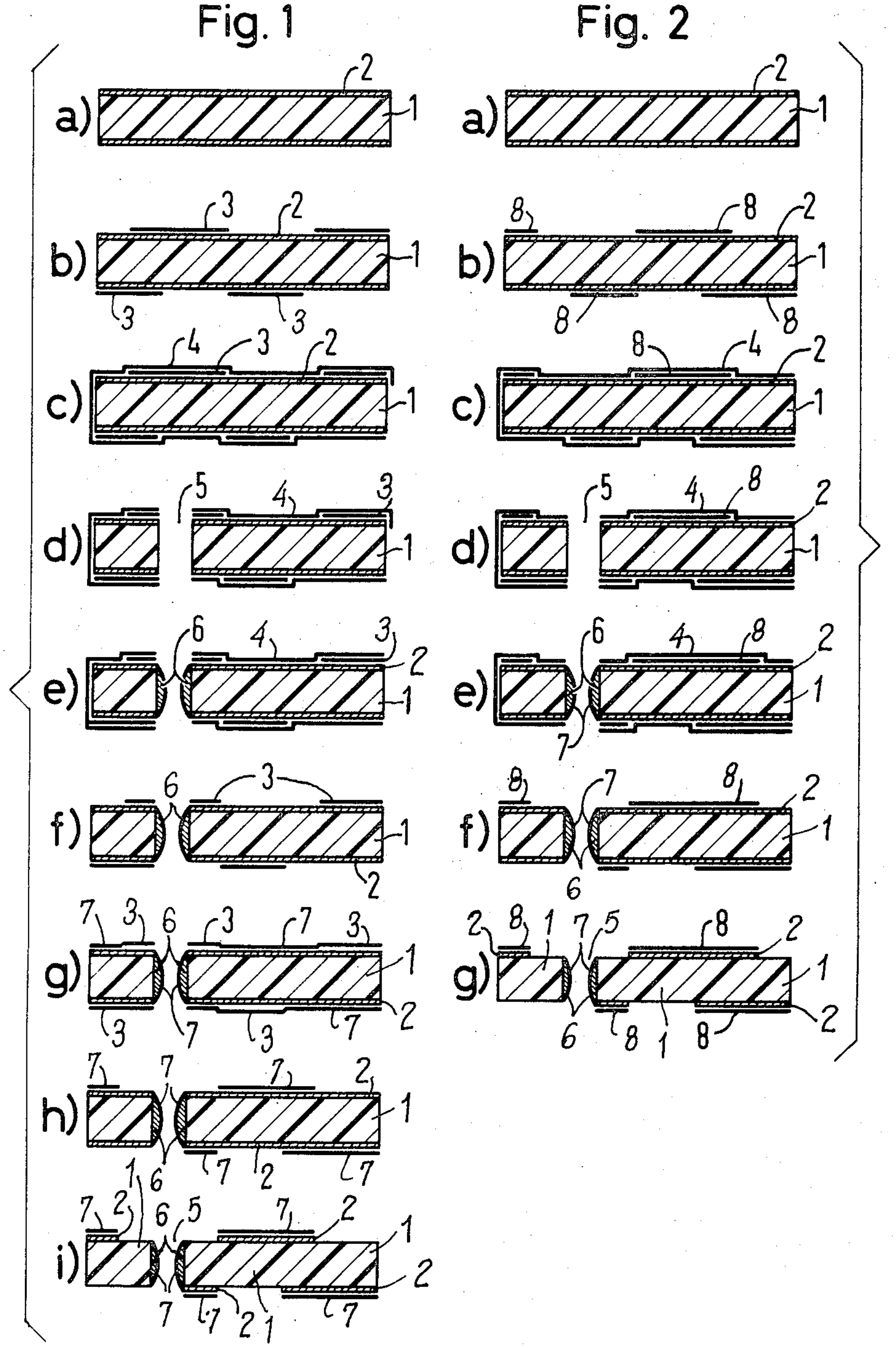

The present invention relates to printed circuit boards and more particularly to printed circuit boards having conductive paths along opposed board surfaces interconnected with conductively-lined through-holes.

There are a number of known processes for producing printed circuit boards. One particular prior art process of producing printed circuit boards having metal-lined through-holes interconnecting conductor path on opposed sides of a circuit board is suggested by German display copy DAS 1,142,926. This process generally consists of producing necessary through-holes for the desired circuits in metal-clad laminate boards, coating the through-hole walls with a layer of metal and then coating the hole walls with an etch-resist material. Thereafter the conductive path or circuits are printed on the board surfaces. This process necessitates filling the through-holes with the material utilized to print the conductive paths and, of course, thereby requires a further operation of removing this material from the holes before the circuit plates are completed. Such an additional step materially adds to the production costs of such circuit boards and is therefore undesirable.

Another prior process relating to such printed circuit boards is suggested by E. Armstrong et al. Hole Only Plating of PC Boards; "Electronic Packaging and Production," May 1966. Generally, this process consists of applying a resist coating on a metal-clad laminate board, then producing the necessary through-holes and after a number of intermediary steps, such as metallizing the entire board and electroplating the hole walls, printing the desired circuits onto the board surfaces. During the metallization of the through-holes, a "wreath" or raised rim-shaped collar is produced and must be removed by sanding. This, of course, is economically unattractive.

Accordingly, it is an important object of the invention to provide a novel process of producing printed circuit boards having metal-line through-holes avoiding the aforesaid disadvantages and effecting a reduction of production costs thereof.

It is another object of the invention to provide a proeess of metallizing through-hole walls circuit boards without the production of raised hole rims or the like.

It is yet another object of the invention to provide a process of producing through-hole circuit boards with greater circuit density then heretofore available.

The invention features a novel process of producing printed circuit boards having metal-lined through-holes generally comprising printing a first resist material onto the surface of a metal-clad laminate board in a pattern predetermined by a desired circuit. Then, a second resist material is uniformly coated on all of the board surfaces and the desired through-holes are produced. At that time a metal layer is applied by a metal-reduction (i.e. non-electrical) process on the through-hole walls and board surfaces. The metal layer is removed from only the board surfaces and then a metal layer is electroplated on the metal-receptive walls and/or board surfaces. The second resist material is removed from the board surfaces before or after the electroplating, and the metal-clad is then removed from the board surfaces in a pattern predetermined by the desired circuits.

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which:

FIG. 1 is an enlarged cross-sectional elevational view illustrating a circuit-board being manufactured in accordance with one embodiment of the process of the invention; and FIG. 2 is a view somewhat similar to FIG. 1 but illustrating a circuit-board being manufactured in accordance with another embodiment of the process of the invention.

Certain present-day requirements in printed circuit boards make it necessary to achieve extreme circuit and hole density on relatively large boards. Naturally, this requires that extremely close tolerances be maintained throughout the manufacturing process. For example, certain through-holes must have a 0.001 inch minimum metal-lining in a 0.025 inch diameter hole on a 1/16 inch thick board, with 0.02 inch conductor path width and about 0.015 inch spacing between such conductor paths. The process of the instant invention provides an efficient, economical and exact process of producing printed circuit boards having metal-line through-holes meeting tolerances as close or closer than those set forth hereinabove.

The process of the invention generally includes providing a circuit board having protected circuit patterns and through-holes; applying a first layer of a conductive material produced by chemical reduction process, such as a metal-salt reduction process only on the through-hole walls; applying an electrically produced layer of a conductive material over the first produced layer; and exposing the circuit pattern and completing desired circuit paths.

More specifically the invention comprises a suitable laminate board composed of insulating material and clad with a layer of conductive material, such as a metal, i.e. copper. The metal-clad board surfaces are printed with a first resist material (i.e. photoresist, silk-screen vinyl lacquer, etc.) in a pattern predetermined by the desired circuits. The printed pattern may be either a negative or positive reproduction of the desired circuits. After the printed pattern is sufficiently fixed to avoid smearing, all the board surfaces, including the printed portions are uniformly coated with a second resist material (i.e. a nitrocellulose lacquer) to produce protected circuit patterns on the board surfaces, and after this layer is dry the necessary through-holes are produced as by drilling, punching, etc. Then a layer of metal, generally copper, is deposited on the through-hole walls and on the coated board surfaces by a metal-salt reduction process. This is a chemical reaction that does not require electrical current. Then the metal layer is removed from only the board surfaces and allowed to remain on the walls of the through-holes. This metal layer cannot adhere very well to the board surfaces because of the resist material coating and is simply removed by mechanical brushing or the like. Thereafter, the metal layer remaining on the through-hole walls is galvanically reinforced, as by electroplating an additional layer of metal thereon. Generally, the metal which is electroplated onto the through-hole walls is more conductive than the first metal layer and reinforces the electrical and physical properties of the first metal layer. Typical metals suitable for electroplating are gold, silver, etc., and preferably gold is utilized. As will be appreciated, the gold layer will adhere not only to the metal-lined through-hole walls but will also adhere on the board surfaces that are free of any resist material, and for the sake of convenience, all such surfaces to which a metal can be electroplated will be referred to herein as metal-receptive surfaces. Thus, the electroplating process coats all of metal-receptive surfaces of the through-hole walls and/or of the board surfaces free from resist material. The uniform coating of resist material (i.e. the second resist material) is removed, by dipping in appropriate etch-bath, before or after the electroplating process, to expose the printed pattern of the resist material (i.e. the first resist material) and portions of the metal-clad of the board surfaces. If necessary, the printed pattern may be retouched after it is exposed. Then depending whether the printed pattern was negative or positive, either the free portions of the metal-clad board surfaces are electroplated with a conductive metal, i.e. Au with a removal of the negative pattern of resist material and subsequent removal of portions of the metal-clad left free of resist material; or merely the free portions of the metal-clad are removed in a pattern predetermined by the desired circuits. Thus, when the original or first resist material is printed in a positive pattern, it remains in place until after the removal of the metal-clad for protection of circuits during subsequent soldering or the like operations. However, when the original resist material is printed in a negative pattern, it is removed after electroplating of a conductive metal onto the metal-receptive surfaces of the through-hole walls and the board surfaces. The removal of the various resist materials and of the metal-clad is generally accomplished by subjecting such materials to an appropriate etch-bath in a conventional manner as well appreciated by workers in the art.

The first embodiment of the invention generally comprises printing onto the metal-clad laminate board surface a resist material (one that is non-metal receptive or "galvanic" proof such as a vinyl lacquer, etc.) in a pattern which leaves the areas or portions of the metal-clad surfaces that are to form the circuits or conductor paths free of such resist materials. Before etching of the metal-clad areas in accordance with the desired circuits, and after the through-hole production, the uncoated (i.e. those exposed after removal of the uniform coating of resist material) metal-clad portions (i.e. those corresponding to the actual conductor paths) and the through-hole walls are electroplated with a conductive metal such as gold and thereafter, the printed resist material is removed and the metal-clad is etched from the areas not covered by the electroplated metal.

The second embodiment of the invention generally comprises printing onto the metal-clad board surfaces a resist material (i.e. a galvanic-proof lacquer) a pattern which covers only those portions of the board surfaces that actually form the ultimate conductor paths. As outlined before, a conductive-metal is then electroplated on only the through-hole walls after the remaining board surfaces have been uniformly coated with an appropriate second resist material (i.e. a nitrocellulose lacquer or the like) and the metal-line through-holes produced. Of course, thereafter the exposed metal-clad is removed, as by an etching with a $CuCl_2$ bath, in accordance with the desired circuits.

Preferably, in the second embodiment of the invention, the resist material, utilized to print the desired circuit pattern on the board surfaces, is not only etch and metal-deposition resistant but is also solder resistant, i.e. the resist layer protects the conductor path covered by it from soldering. Thus, this printed resist material can be used during subsequent soldering operations as a solder-protecting lacquer without the necessity of applying a special coating for such a purpose.

Referring now to the drawings, it will be noted that the two figures generally illustrate the sequential process steps that a circuit board undergoes in accordance with the various embodiments of the invention. FIG. 1 illustrates steps (*a*) through (*i*), which is a simplified representation of the first described embodiment of the invention, i.e. the negative print process that a circuit board undergoes in the manufacture thereof in accordance with the principles of the invention. An appropriately sized laminate board 1 composed of an insulating material (i.e. Bakelite, a tradename for a polyethylene or polystyrene resin material) is clad with a foil of conductive material 2 such as Cu at the initial step. Thus, step (*a*) comprises providing an insulating laminate board 1 which is clad on both sides thereof with a conductive copper layer 2. Then, a resist material is printed onto such metal-clad surfaces in a pattern predetermined by the desired circuits. In FIG. 1, step (*b*) comprises printing a negative circuit pattern of a resist material 3 (i.e. a first resist material) which may be photoresist, silk-screen vinyl lacquer etc. The resist material 3 is non-receptive to the deposition of metals and thus prevents the areas of the metal-clad surface covered by it from being coated with an ensuing metal layer during the subsequent process steps.

Thereafter, all the surfaces, the printed and unprinted metal-clad surfaces, are substantially uniformly coated with an additional layer of a resist material. For sake of convenience, this material may be designated the second resist material and is non-metal receptive (i.e. galvanic-resistant or galvanic proof) such as for example, a stripable nitrocellulose lacquer, such as available under the trade name Nolan, or a normally unstripable nitrocellulose lacquer, such as available under the trade name Naz-Dar. Thus, step (*c*) comprises uniformly coating all of the board surfaces with a layer 4 of a second resist material. Thereafter, as indicated at step (*d*), the desired holes 5 are produced as by drilling, punching, etc. Then all the surfaces of the circuit board including the hole walls are metallized without an electrical current. Preferably, a copper salt is reduced onto such surfaces so that the individual copper particles are caused to contact all such surfaces. It will be appreciated that the copper particles cannot adhere to the flat surfaces because of resist layer 4 but that copper particles are deposited along the through-hole walls to form a metal-lining 6 along such wall surfaces. The metal particles which are deposited on the flat plate surfaces are removed by a mechanical brushing. Thus, step (*e*) comprises of providing a metal-lined layer 6 onto the through-hole walls and this is accomplished by providing a metal layer on all of the board surfaces and hole walls by a metal-reduction process and thereafter removing such metal layer from only the board surfaces.

Step (*f*) comprises in removing resist layer 4 by contacting the board surfaces with an appropriate etch-solution or solvent solution. Then if necessary, the first resist layer 3 may be retouched to ensure that the proper pattern is maintained on the metal-clad surfaces. Step (*g*) comprises electro-depositing (i.e. galvanically reinforcing or electroplating) a metal layer 7 onto the metal receptive surfaces of the metal-clad surfaces and through-hole walls. As will be appreciated, only those areas of the metal-clad surfaces which are not covered by a resist material are metal-receptive and that the areas of the metal-clad surface covered with resist layer 3 are not plated. The metal layer 7, which is preferably composed of gold, thus represents the actual desired printed circuit on the laminate board. Step (*h*) comprises in removing the resist layer 3, again by a suitable etching or a solvent bath. Step (*i*) illustrates a removal of select portions of the metal-clad layer 2 as by etching in a $CuCl_2$ etching bath. In this manner the desired conductor path or circuit are provided on the laminate board. FIG. 1 thus illustrates laminate board 1 having select areas thereof clad with a first metal layer 2 and these metal-clad areas being coated with a second metal layer 7, generally for increased conductivity along the desired circuit paths. The through-holes 5 are first nonelectrically coated with a first metal layer 6 and then electroplated with a second metal layer 7 to provide the conductive metal-lined through-holes. It will be noted that by producing a printed circuit board having metal-lined through-holes in accordance with the principles of the invention, no raised hole rims are encountered and close tolerances are easily maintained.

FIG. 2, in steps (*a*) through (*g*), illustrates the second or positive printing process of the invention, again in somewhat simplified form. It should also be noted that like reference numerals are utilized to designate like elements throughout the figures and that at least the steps (*a*) through (*d*) of FIG. 2 are essentially similar to the similar steps in FIG. 1. Briefly, step (*a*) comprises providing an insulating laminate board 1 having a metal-clad layer 2 along opposed surfaces. Then in step (*b*) a resist lacquer layer 8 is printed onto the metal-clad surfaces 2 in a pattern that covers those portions or areas of the metal-clad layer 2 which later formed the actual conductor paths, i.e. a positive printing. The resist lacquer is composed of a material that is not only galvanic-proof (i.e. non-metal receptive) and etch-proof but is also solder proof so that it may be utilized as a solder-stop varnish. A number of such lacquers are known and a particular material suitable for use is the soldering-stop lacquer 184–12K (a trade name) available from the Warrow Firm. Thus, as indicated hereinbefore, the printing process in step (*b*) of FIG. 2 applies resist layer 8 in a positive circuit pattern (as distinct from step (*b*) of FIG. 1 wherein the resist layer 3 is printed in a negative pattern) and leaves those portions of the metal-clad layer 2 which do not form portions of the circuits free from such a resist layer.

Step (*c*) of FIG. 2 comprises uniformly coating all of the surfaces of the metal-clad board, i.e. those coated with layer 8 and those left free therefrom, with a second resist layer 4. Resist layer 4 is composed of material which is galvanic-proof (i.e. non-metal receptive) similar to that utilized in step (*c*) of FIG. 1. Thereafter, in step (*d*) of FIG. 2, the desired holes 5 are produced as by drilling, punching, etc.

Then, a layer 6 of a metal (i.e. a first metal layer) such as copper, is non-electrically provided (i.e. a metal-reduction process) onto the plate surfaces and on the through-hole walls and such metal layer is removed from the board surfaces, similarly to that explained in conjunction with step (*e*) in FIG. 1. In this manner, a metal layer 6 is deposited only on the through-hole walls and there is no rim or "wreath" produced around the through-hole edges at the board surfaces. Thereafter, and during step (*e*) of FIG. 2, a second metal layer 7 is electroplated onto the metal-receptive surfaces of the composite structure, i.e. onto the metal-lined through-hole walls since the plate surfaces are still coated with non-metal receptive resist materials 4 and 8. The metal layer 7 may be composed of any electroplatable metal or other material which is conductive and is preferably composed of gold.

The next step (*f*) comprises removing the uniform-coated layer 4 from the board surfaces, and this is conveniently done by subjecting such layer to an etch-bath as well understood by the workers in the art. Thereafter, if necessary, layer 8 may be retouched to ensure that the proper circuit pattern is still covered by this material. Step (*g*) is then commenced and comprises etching portions of the metal-clad layer 2 from the board surfaces with appropriate etch-bath such as $CuCl_2$ etch or mordant bath. It will be noted that after step (*g*) the circuit board is completed having the desired circuit paths therein, however, the circuit paths along the laminate board surfaces (i.e. the portions of the metal-clad layer 2 remaining) are still covered with a layer 8 to protect the same during subsequent soldering operations and the layer 8 functions as a soldering-stop. Of course, after the necessary soldering operations have been completed the layer 8 is removed.

It will thus be noted that the invention provides a means for producing metal-lined through-hole walls in printed circuit boards wherein raised rims around the through-hole edges are avoided in a very expeditious and economical manner. The process of the instant invention allows production of such metal-lined through-hole printed circuit boards without utilization of any unnecessary steps and yet allows precision manufacturing of such circuit boards. It will also be noted that by producing the through-holes in the circuit boards before the actual production of the desired circuits a further advantage is attained in that the danger of lifting off of solder eyes, especially on the drill-immergence side of a circuit board, is completely avoided. A further advantage of the invention is that the circuit boards have to be subjected to metal-reduction processes (i.e. metallized without electrical current) only once, whereas the heretofore known processes required the utilization of metal-reduction processes at least twice to accomplish similar results.

It will be seen that the instant invention provides a novel process for producing circuit boards having predetermined conductive paths on opposed flat surfaces thereof and through-hole metal-lined walls interconnecting said paths comprising providing a metal-clad insulating circuit board, selectively printing onto the metal-clad board a first resist material layer in a pattern predetermined by the desired conductive paths, uniformly applying a second resist material layer onto the metal-clad board, perforating the metal-clad board at selected areas thereof to produce through-holes, producing a metal-layer on all the board surfaces and through-hole walls, removing such metal-layer from the board surfaces, electro-depositing a second metal layer on all of the metal-receptive surfaces of the board and through-hole walls, removing the layer of second resist material from the metal-clad board (which can also occur before the electroplating step) and selectively removing portions of the metal-clad from the board surfaces in accordance with the predetermined conductor paths.

In summation, the invention comprises a method of coating through-hole walls in a circuit board with a conductive material characterized with the avoidance of wreaths at the through-hole openings comprising providing a circuit board having protected circuit patterns and through-holes; applying a non-electrically produced layer of a conductive material only on the through-hole walls; applying an electrically produced layer of a conductive material over the non-electrically produced layer; and exposing the circuit pattern and completing desired circuit paths.

I claim:

1. A process for producing a circuit board having predetermined circuits on opposite surfaces thereof and metal-lined through-holes interconnecting said circuits, comprising the sequential steps of, (1) providing an insulated board having opposed surfaces clad with a conductive material;
(2) printing a pattern on selected areas of said opposed surfaces predetermined by said circuits with a first resist material;
(3) uniformly coating all of said opposed surfaces with a second resist material;
(4) producing through-holes at selected areas of said opposed surfaces;
(5) applying a first conductive metal on said opposed surfaces and on the through-hole walls by a chemical reduction process;
(6) removing said conductive metal from only said opposed surfaces;
(7) electroplating a second conductive metal on the through-hole walls;
(8) removing the second resist material from said opposed surfaces; and (9) selectively removing said conductive material from said opposed surfaces in accordance with said predetermined circuits.

2. The process as defined in claim 1 wherein the first resist material printed on the opposed surfaces is a solder-stop material.

3. The process as defined in claim 1 wherein the conductive material and the first conductive metal are copper and the second conductive metal is gold.

4. The process as defined in claim 1 wherein the resist materials are selected from groups consisting of nitrocellulose lacquers, silk-screen vinyl lacquers and solder-stop lacquers.

References Cited

UNITED STATES PATENTS

| | | | |
|---|---|---|---|
| 3,457,638 | 7/1969 | Johnson | 204—15 |
| 2,872,391 | 2/1959 | Hauser, et al. | 204—15 |
| 3,208,921 | 9/1965 | Hill | 204—15 |

JOHN H. MACK, Primary Examiner

T. TUFARIELLO, Assistant Examiner

U.S. Cl. X.R.

117—212